United States Patent [19]
Goel et al.

[11] Patent Number: 5,665,326
[45] Date of Patent: Sep. 9, 1997

[54] METHOD FOR SYNTHESIZING TITANIUM NITRIDE WHISKERS

[75] Inventors: Arvind Goel; Vithal Revankar, both of Buffalo, N.Y.

[73] Assignee: Advanced Refractory Technologies, Inc., Buffalo, N.Y.

[21] Appl. No.: 556,704

[22] Filed: Nov. 13, 1995

[51] Int. Cl.$^6$ ............................................. C01B 21/076
[52] U.S. Cl. .................................. 423/411; 423/409
[58] Field of Search ............................. 423/409, 411

[56] References Cited

U.S. PATENT DOCUMENTS

| | | | |
|---|---|---|---|
| 3,012,856 | 12/1961 | Berry | 423/411 |
| 3,370,923 | 2/1968 | Hough | 423/411 |
| 4,756,791 | 7/1988 | D'Angelo et al. | 423/411 |
| 4,867,761 | 9/1989 | Brandt et al. | |
| 4,883,559 | 11/1989 | Bamberger | |
| 4,888,084 | 12/1989 | Nixdorf et al. | 423/411 |
| 5,118,488 | 6/1992 | Bamberger | |
| 5,417,952 | 5/1995 | Koc et al. | 423/411 |

FOREIGN PATENT DOCUMENTS

| | | | |
|---|---|---|---|
| 6167 | 3/1942 | Japan | 423/411 |
| 27312 | 2/1987 | Japan | 423/411 |

OTHER PUBLICATIONS

Perkins et al., "Reactive Synthesis of TiB$_2$ in the Presence of a Reactive Gas," (1992) (no month available).

Perkins et al., "Synergistic Effects of Coupled Combustion Synthesis and Vapor Phase Transport in the Synthesis of Advanced Materials," Proceedings of the International Conference of Advanced Synthesis of Engineered Materials, ASM International (1992) (no month available).

Perkins et al., "The Effect of a Gaseous Transport Species on Combustion Synthesis", Spring Meeting of the American Ceramic Society (Apr. 15, 1992).

*Primary Examiner*—Wayne Langel
*Attorney, Agent, or Firm*—Nixon, Hargrave, Devans & Doyle

[57] ABSTRACT

A method for making titanium nitride whiskers comprising reacting titanium in the presence of nitrogen in a direct nitridation reaction, concurrently reacting titania in the presence of nitrogen in a carbothermal nitridation reaction, optionally in the presence of a transport species reaction under conditions necessary to make titanium nitride whiskers.

23 Claims, 1 Drawing Sheet

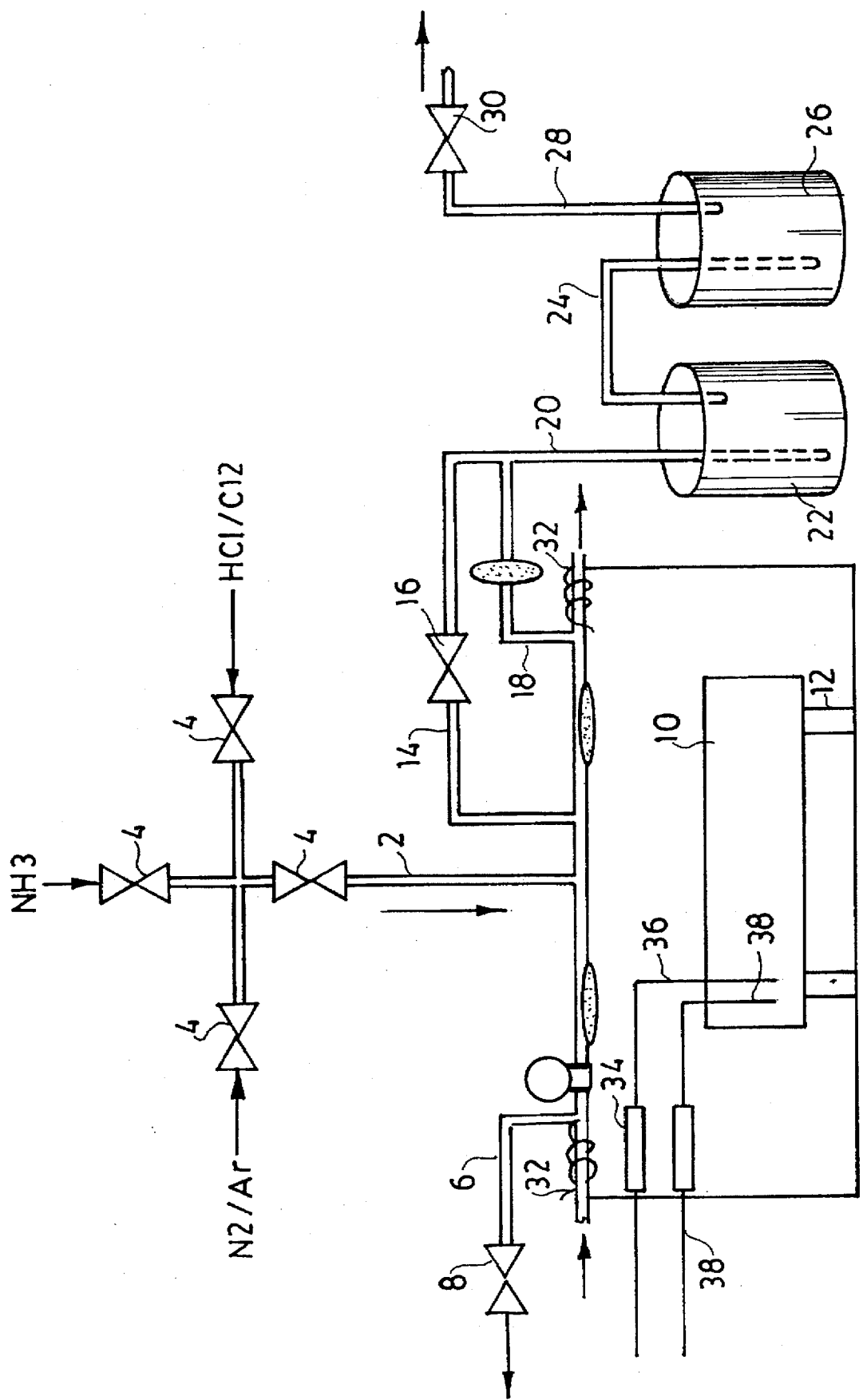

METHOD FOR SYNTHESIZING TITANIUM NITRIDE WHISKERS

FIELD OF THE INVENTION

The present invention relates to improved methods for making titanium nitride whiskers. More specifically the invention relates to methods for increasing the purity, % yield and aspect ratios and manufacturing capacity of titanium nitride whiskers while lowering their cost.

BACKGROUND OF THE INVENTION

Composite materials are a useful class of materials that are often both very strong, and lightweight. Composites contain a mixture, or mechanical combination on a macro scale, of two or more materials that are solid in the finished state, are mutually insoluble, and differ in chemical nature. The use of composite materials in refractory applications is relatively new. Many states and forms of composite materials having desirable characteristics are currently being investigated.

In the field of composites, it is often desirable to incorporate ceramic-containing "whiskers" into polymeric, ceramic, etc. matrices. Whiskers are single, axially oriented, crystalline filaments of metals, refractory materials, carbon, boron, etc. that have high length to diameter ratios (aspect ratios). Ceramic whiskers have tensile strengths of from about 3 to about 6 million psi and have very high elastic moduli. Their useable upper temperature limit may be as high as 1700° C., and in inert atmospheres, may be as high as 2500° C. When ceramic whiskers are incorporated into the matrix of refractory materials such as ceramics, the overall strength and fractive toughness of the material can be increased. Such material properties are is important for many ceramics applications, e.g. cutting surfaces, internal combustion engines, turbine and propeller parts, spacecraft and airplane exteriors, etc.

Titanium nitride is one material that has been incorporated into composites. Titanium nitride is an attractive material because of its hardness, high temperature stability, electrical conductivity and other desirable mechanical properties. The physical state of titanium nitride can be in the form of titanium nitride whiskers to facilitate their incorporation into composites.

Titanium nitride whiskers (TiNw) have a relatively high melting point of about 2950° C., and a hardness of 8 to 9 on the Mohs scale. TiN whiskers also exhibit good material strength, high temperature stability, and electrical conductance (for refractory materials). Titanium nitride whiskers have a tensile strength at least equal to silicon carbide whiskers (2000 to 6000 kpsi), and a higher Young's modulus and thermal expansion coefficient than SiC whiskers. Further, titanium nitride whiskers are thought to be inherently more compatible than SiC whiskers with other components in a composite. Thermo-chemical calculations indicate that TiN whiskers should be compatible, and stable in contact with SiC, $Al_2O_3$, $ZrO_2$, $Si_3N_4$, and $TiB_2$. Further, TiN whiskers have better chemical stability with iron aluminides and nickel aluminides than does SiC, and thus may find use in these and other metal matrix composites. Due to their higher thermal and electrical conductivity, TiN whiskers are also an excellent candidate for polymer matrix composite (PMC), ceramic matrix composite (CMC), and high temperature metal matrix composite (MMC) applications. For example, for applications requiring thermal management or electrical conductivity the compatibility of TiN whiskers with ferrous alloys, TiNw-containing $Al_2O_3$ composites have been shown to perform well as cutting tools for ferrous alloys. The lack of available, economical TiN whiskers in commercial quantities has limited their widespread use.

Many approaches have been suggested in the literature for the successful synthesis of TiN powder, including vapor/plasma synthesis; thermal decomposition of titanium salts, sol-gel processing and chemical vapor deposition (CVD). However, the known processes for making TiN whiskers have exhibited low whiskers yields; inadequate for large scale manufacture. TiN whisker synthesis, methods, including carbothermal reduction-nitridation (CTN), thermal decomposition of salts, and chemical vapor deposition also have not produced satisfactory. In addition to low whisker yields, these processes require high reaction temperatures, furnace equipment, long reaction times of up to 72 hours, and are not otherwise conducive to large scale whisker manufacturing processes. These and other difficulties with TiN whisker-making methods have limited their feasibility and widespread use.

SUMMARY OF THE INVENTION

The present invention is directed to a low cost, high yield, and short-reaction-time method of making titanium nitride whiskers. In one embodiment, the present invention relates to a method for making titanium nitride whiskers by concurrently reacting titania in a carbothermic nitridation reaction, and reacting titanium in a self-propagating high temperature direct nitridation reaction under conditions necessary to make TiN whiskers. The present invention further relates to conducting the aforementioned reactions concurrently in the presence of a transport species reaction, and nitrogen, under conditions necessary to make TiN whiskers.

The present invention also relates to a method for making titanium nitride whiskers by concurrently reacting titanium in a direct nitridation reaction, and a transport species reaction, both under conditions necessary to make titanium nitride whiskers.

The present invention also relates to a method for making titanium nitride whiskers by providing a reactant bed comprising ammonium chloride, titanium, titania and a metal-containing carbon catalyst. A flow of nitrogen is provided to the reactant bed. The bed is then locally heated via an externally applied heat source (e.g. heated wire) to a temperature sufficient to initiate a direct self-propagating high temperature nitridation reaction, concurrently with a carbothermic nitridation reaction, concurrently in the presence of a transport species reaction, whereby titanium nitride whiskers are produced.

The present invention further relates to a method for making titanium nitride whiskers comprising providing titanium and titania reactants to a reactant bed. A metal-containing carbon catalyst is mixed with the titania. An amount of ammonium chloride is placed into the reactant bed. A flow of nitrogen is directed to the reactant bed. The reactant bed has a bulk density from about 0.05 g/cc to about 0.2 g/cc.

The invention also relates to a method for making titanium nitride whiskers, whereby a reactant bed is established comprising ammonium chloride, titanium, and a metal-containing carbon catalyst. The reactant bed has a bulk density no greater than about 0.05 g/cc, and preferably from about 0.01 to about 0.05 g/cc. The reactant bed is heated in the presence of a flow of nitrogen gas. The titanium is reacted with nitrogen in a self-propagating high temperature direct nitridation reaction. Concurrently, the titanium reacts with chlorine and nitrogen. This combination of reactions results in TiNw formation.

Still another embodiment of the present invention relates to titanium nitride comprising about 25 to about 60% by volume titanium nitride whiskers, with the whiskers having an aspect ratio from about 7 to about 20, made from the methods of the present invention.

The methods of the present invention for making titanium nitride whiskers have several advantages over the known processes including high whisker yield, low cost, simplicity, availability and low cost of starting materials, high reproducibility, good whisker purity and short reaction time.

BRIEF DESCRIPTION OF THE DRAWING

FIG. 1 is an exposed side view schematic representation of a box reactor in which batch-type TiNw synthesis occurs.

DETAILED DESCRIPTION OF THE INVENTION

The present invention is directed to a low cost, high yield, low temperature method of making titanium nitride whiskers. In one embodiment, the present invention relates to a method for preparing titanium nitride whiskers (TiNw) by concurrently conducting an endothermic carbothermic nitridation reaction in the presence of an exothermic self-propagating high temperature direct nitridation reaction and, optionally, a vapor transport species reaction.

Therefore, according to one embodiment of the present invention, two distinct but related reaction mechanisms are made to occur concurrently. In this way unprecedented batch yields and whisker purity of TiN whiskers are achieved. The concurrent reaction mechanisms occur as follows:

1. Self-Propagating High Temperature Synthesis (SHS) Direct Nitridation Reaction (Exothermic)

$$2Ti + N_2/NH_3 \xrightarrow{catalyst} TiNw + TiNp + 1.5H_2 + Heat$$

2. Carbothermal Nitridation (CTN) Reaction (Endothermic)

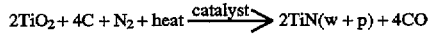
$$2TiO_2 + 4C + N_2 + heat \xrightarrow{catalyst} 2TiN(w+p) + 4CO$$

In the above reactions, the "w" refers to titanium nitride whiskers, while the "p" denotes titanium nitride particulate that includes titanium nitride powder, but no whiskers.

The SHS reaction shown above is an exothermic reaction. The heat released is absorbed to an extent to drive the endothermic CTN reaction. As a result of the combination of these two reactions occurring together, additional energy in the form of heat need not be supplied to the reaction via external heating means, e.g. a furnace. In the SHS reaction, titanium is provided in the form of powder, fiber or shavings, with powder being preferred. Nitrogen is provided to the reaction in the form of nitrogen gas, and also from the dissociation of ammonium chloride in the presence of heat. Ammonia gas may also be used as a nitrogen source. A combination of titanium nitride whiskers and titanium nitride particulate is formed as reaction product. Heat is supplied to the SHS reaction only to initiate the reaction. The heating means is preferably a heating coil or other hot wire apparatus provided to the reactant bed, but may be any means capable of delivering an amount of energy necessary to ignite a reactant bed, including a spark, a laser, etc.

The current self propagating high temperature synthesis process has several key advantages over the other processes including rapid synthesis rates, no high temperature equipment requirements, relatively easy scale-up and high purity. The reaction is preferably initiated locally by means of an external energy source with short term service, and propagates throughout the reactant bed. The reaction between titanium metal and nitrogen is highly exothermic, and a self-sustaining reaction front can be maintained even at 1 atmosphere pressure. The exothermic dissolution of nitrogen (approximately 24 wt % at 0.1 MPa) facilitates TiN synthesis even at low gas pressure.

However, other constraints, especially relating to mass and heat transport, exist. The reactant bed must be porous enough to allow nitrogen transport into the bed even after most of the titanium has reacted. Diluents are required to control reaction temperature and to prevent melting in the bed. Porosity is controlled by means of diluents and bed geometry. For the purpose of the present invention, titania, ammonium chloride and carbon are considered to be the diluents. TiN powder may also be added to the reaction to act a diluent.

The type of fibrous material used to decrease the bulk density of the bed is also critical. Once the SHS reaction is initiated, it will generate heat sufficient to run to completion, and will provide excess heat to drive the CTN reaction.

In the endothermic CTN reaction, titanium dioxide or titania ($TiO_2$), preferably in the form of a powder, reacts with carbon provided from a carbon source, preferably carbonized cotton, carbonized cellulose or high surface area carbon powder, most preferably carbonized cotton, and nitrogen in the presence of a metal-containing catalyst. A combination of TiN whiskers and TiN particulate are formed as a product, along with carbon monoxide. The heat absorbing aspect of the CTN reaction helps to regulate and stabilize the reaction temperature in the reactant bed. In known exothermic TiNw syntheses, the reaction temperature must be regulated by exterior cooling means, such as circulating cooling gases or liquids about the reactor. In the present invention, the CTN reaction works to keep the SHS reaction from creating an excessively high reaction temperature within the reaction chamber. By carrying out the carbothermic nitridation (CTN) of titania ($TiO_2$) simultaneously with the SHS (direct nitridation) reaction, the temperature of the SHS reaction is therefore controlled by actively absorbing heat in-situ. Such heat control is important. If the reaction temperature is not kept below about 1660° C., the titanium can melt or form undesirable titanium carbides. If the titanium melts, the bulk density of the reactant bed increases (porosity decreases) and the available nitrogen cannot react with the titanium efficiently enough to produce high reaction conversion. In addition, if the reaction temperature exceeds 2100° C., the newly formed TiN whiskers may be converted to particulate or form other undesirable phases.

The carbothermic nitridation (CTN) reaction further provides the opportunity to use low density carbonized (cotton, cellulose or other organic) fibers or high surface area carbon powder as the carbon source. When the CTN is carried out simultaneously with the SHS reaction, the use of this low bulk density, high surface area carbon along with the low bulk density titania, helps to increase the reactant bed porosity. This increase in porosity further facilitates whisker growth as the nitrogen in the system is better able to react with the titanium and titania in the reactant bed. Finally, since both the SHS and the CTN reactions produce TiN as whiskers and particulate, the total TiN whisker output for the reaction is increased.

In addition to the SHS and CTN reactions, it is believed that the TiNw % yield observed from the two reactions is enhanced by the presence of a third reaction mechanism. It is believed that halogen and halide atoms released from halogen-containing or halide-containing gases, preferably the chlorine atoms and derivative ions (e.g. chloride ions) released from the ammonium chloride, as well as the hydrogen chloride gas optionally provided, facilitate a vapor transport species reaction whereby the titanium and titania react with the chlorine atoms and chloride ions. It is believed, that vapor transport gases or halides, react with reduced titanium or titanium-containing ions, to form titanium chlorides ($TiCl_n$, when n=1 to 4) which is transported to whisker growth sites in the reactant bed. There, the titanium is reduced and reacts with nitrogen to form TiN, at least partially in the form of whiskers, according to the following possible reaction sequence:

3. Transport Species Reaction Mechanism

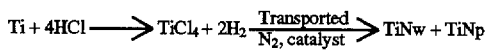

OR

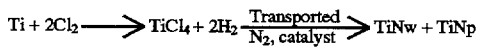

These above mechanisms are not completely understood. However, it is believed, based upon the high TiNw % yields obtained, that a third mechanism is contributing to whisker growth in addition to the CTN and SHS mechanisms. When an excess of chlorine is made available to the reactor (e.g. HCl or $Cl_2$) the whisker yields increase. The combination of TiN whiskers being formed from the three simultaneous reactions results in outstanding TiNw % yield of up to from about 20 to about 50% by volume of total TiN (TiN whiskers and particulate), with an average observed yield of from about 35 to about 40% by volume. Vapor transport may also explain high whisker growth rates in an otherwise solid state reaction.

To create a proper atmosphere for whisker growth, and to produce optimum yields of titanium nitride whiskers, certain reaction parameters must be closely controlled. The main parameters are reactant composition, bulk density of the reactant mass (porosity of the reactant bed), the catalyst selected, and the percolating/transport species material (e.g. ammonium chloride).

The porosity, or bulk density, of the reactant bed plays an important role in obtaining the high conversion and whisker yields which can be further manipulated by means of diluents and additives. The type and dimension of titanium, titania, and carbon material selected, directly affects the bulk density of the reactant bed.

Bulk density refers to the mass per unit volume of a powder. As mentioned above, it is important that the available nitrogen in the system easily gain access to the available titanium to achieve optimum whisker growth. The porosity of the reactant bed is provided mainly by the dimensions and types of titanium, the amount of titania provided, the titanium to titania ratio, and the carbon material selected. To optimize TiNw yield, the porosity or bulk density of the reactant bed is established at from about 0.05 g/cc to about 0.20 g/cc, more preferably from about 0.05 g/cc to about 0.10 g/cc, with 0.05 g/cc being most preferred to achieve the highest TiNw yields.

If the reactant bed bulk density is kept sufficiently low, (e.g. to no greater than about 0.05 g/cc, and preferably from about 0.01 to about 0.05 g/cc), TiNw whisker yields of from about 5 to about 20% by volume are still obtainable even if no titania is added to the mixture. In this instance, the carbothermal nitridation reaction will not occur, and only the SHS and transport species reaction will proceed as follows:

1. Self-Propagating High Temperature Synthesis (SHS)
   Direct Nitridation Reaction (Exothermic)

2. Transport Species Reaction Mechanism

As noted above, the "w" refers to titanium nitride whiskers, while the "p" denotes titanium nitride particulate that includes titanium nitride powder, but no whiskers. In the absence of the endothermic CTN reaction, cooling means such as circulating fluids or gases must contact the reactor to keep the reactor temperature from reaching excessively high temperatures.

The titanium source materials are titanium powder, fibers or shavings, preferably powder. The titania ($TiO_2$) is preferably in the form of a fine powder. These are readily available, and inexpensive starting materials. The titanium powder has a preferred particle size of about 325 mesh (99% pure), or about 10 to about 100 microns, more preferably about 25 to about 45 microns.

The titania is preferably ground with a mortar and pestle, before reacting, to remove oxide layers from its surface, and has a particle size in the range of from about 0.1 to about 1 micron, and preferably from about 0.5 to about 1 micron. The dimensions of the titania also affects the reaction bed porosity (bulk density) and is therefore important to the reaction rate and the % yield of TiNw.

A metal-containing carbon catalyst is provided to catalyze the reactions of the present invention. The catalyst comprises a carbon source which may be a carbonized fiber such as any low density carbonized cotton, cellulose or other organic fiber, and is preferably carbonized cotton fiber. As an alternative, a low density, high surface area carbon powder may be used as a carbon source (e.g. Raven™, Carbon Chemical Co., Atlanta, Ga.).

The metal component of the metal-containing carbon catalyst may be made from any suitable metal-containing or Si-containing compound, but is preferably Ni, Fe, Mg, Co, or compounds containing said metals, with nickel- and magnesium-containing compounds being particularly preferred for the high % yield production of titanium nitride whiskers. The selected metal is preferably provided as a solution of metal salts applied to the carbon source. Preferred metal salt solutions are iron nitrate, manganese acetate, cobalt acetate, magnesium nitrate, nickel nitrate, and combinations thereof, with nickel nitrate being particularly preferred. The catalyst metal species are finely dispersed in solution on the low bulk density carbon source under wet soluble conditions to assure that the catalyst remains in place during the reaction. The resultant metal-containing carbon mass is dried and heat treated to get a finely dispersed catalyst.

Alternatively, the metal-containing solution is prepared, followed by immersing the carbon source into the metal solution. A small amount of water may be added, if necessary, until the material is completely immersed. The resultant material is dried, either on a hot plate for about one hour, or at room temperature overnight. This metal-containing carbon mass is heat treated in a nitrogen, argon or hydrogen atmosphere at around 400° C. for 30 minutes. The carbon source now comprises the metal-containing material and is together considered to be the metal-containing carbon catalyst.

In a preferred embodiment, a mixture is made from the titanium, titania, ammonium chloride and metal-containing carbon catalyst by mixing the components by hand (e.g. mortar and pestle) or mechanically (e.g. V-blender). A thin layer of ammonium chloride is placed into the bottom of a reaction vessel or "boat". The titanium-containing mix is then placed over the ammonium chloride bed layer into a reaction vessel. The preferred reaction vessels preferably have a volume capacity from about 50 cc to a capacity greater than about 1600 cc. The ammonium chloride acts as a so-called percolating agent, giving rise to transport species to assist the reaction by providing an additional nitrogen and chlorine source. In its role as a percolating agent, the ammonium chloride is thought to assist in maintaining the porosity, or bulk density, of the reactant bed throughout the reaction at a level of from about 0.05 to about 0.2 g/cc, preferably 0.05 to about 0.1 g/cc, and more preferably about 0.05 g/cc.

The reaction chamber may take any form suitable for conducting the above-described reactions as would be readily apparent to one skilled in the field. The reaction chamber preferably may be any type of enclosed device which is capable of withstanding a positive pressure, or being vacuum pumped to a negative pressure. The reaction chamber has gas ports to allow gas to be pumped into and away from the reaction. One preferred chamber is shown schematically as FIG. 1. In FIG. 1, a batch reactor 1 has a gas inlet 2 through which any needed combination of $NH_3$, $N_2$, Ar, HCl and/or $Cl_2$ are directed into the reactor. Valves 4 are adjusted to regulate gas flow through inlet 2 into reactor 1 in the direction of the arrows shown. The reactor may be pumped to a negative pressure via entrance line 6 having valve 8 attached to a vacuum (not shown). A reaction vessel or "boat" 10 which contains the reactant mix is placed onto porous carbon blocks 12. Exit line 14 having valve 16 and back pressure regulator line 18 join at line 20. When valve 16 is in the "open" position, line 20 directs the gaseous contents of reactor 1 under pressure to first alkali scrubber tank 22. Line 24 directs the partially treated gas to second alkali scrubber tank 26. Exhaust line 28 directs the scrubbed gas through valve 30 (when open) to the system's final exhaust (not shown). Cold water may be passed through a circulating line 32, in the direction of the arrows shown, to cool the reactor. A heating implement 34 having wire leads 36 is connected to a power source (not shown) via wires 38. Wire leads 36 are placed in contact with the reactant bed 38.

In one preferred reaction scheme, an amount of titanium powder having a particle size of from 10 to 100 microns, more preferably from about 25 to about 45 microns (99% pure) is ground via mortar and pestle or V-blender for about 2 minutes. An amount of titania having an average particle size of from about 0.1 micron to about 1.0 micron, metal-catalyst carbon mix and ammonium chloride are added to the ground titanium powder and mixed together via blender or hand mixing for 5 minutes. The powdered mix is placed into a carbon reaction vessel, or "boat", to which has been first added a uniformly dispersed bed of ammonium chloride. The boat is then placed into the reaction chamber. The air in the chamber is evacuated by means of a vacuum pump. The chamber is then purged with nitrogen for 2 minutes at a flow rate of up to 22 SCFH. An HCl gas flow is provided to the chamber at a rate of about 0.5 SCFH. A positive pressure of from about 8 to about 10 psi is maintained throughout the reaction. One end of the reactant bed in the reaction vessel is then ignited by means of a molybdenum wire mounted on a copper electrode. The reaction proceeds through the bed within about 2 minutes. TiN whisker yields of up to about 50% by volume have been achieved by the methods of the present invention, with the average % by volume yield of TiN whiskers to total TiN (whiskers and particulate) being from about 20% to about 35% by volume. Overall TiN yields of about 90% to about 110% (based on starting amount of titanium) were obtained, compared to a theoretical yield of from about 90% to about 102% (based on total TiN formation, i.e. total whiskers and particulate). The methods of the present invention allow the whisker sizes and yields obtained to be varied by changing the conditions and amounts of additives to meet the desired product specifications.

$$\text{Overall yield \%} = \frac{\text{Total crude weight}}{\text{Original raw weight}} \times 100$$

The following examples serve only to further illustrate aspects of the present invention and should not be construed as limiting the invention.

EXAMPLE 1

Preparation of the Metal-Containing Catalyst—Nickel Nitrate Solution

The catalyst mix is prepared as follows. Nickel, in fine powder form was dissolved with concentrated nitric acid. An amount of nickel powder, 0.764 gram mole (45 g) was weighed and set aside. An amount of 67% nitric acid, 1.53 gram mole (147 g) was accurately weighed and placed into a beaker. Fifty cc of distilled water was added to the beaker. The previously weighed nickel powder was added to the beaker in small increments until all of the material was consumed without creating an excessively exothermic reaction. The resulting material was the 0.764 gram mole nickel nitrate solution.

EXAMPLE 2

Preparation of the Metal-containing Carbon Catalyst

An amount, 1.677 gram mole (99% pure) carbonized cotton fiber (20.0 g) was accurately weighed and mixed with 0.764 gram mole of the nickel nitrate of Example 1. A small amount of water was added until the carbon material was completely immersed. The resultant material was dried on a hot plate for one hour. This mass was heat treated in nitrogen, argon or hydrogen atmosphere at around 400° C. for 30 minutes.

EXAMPLE 3

Loading of the Reaction Vessel

A weighed amount, 16 g of titanium powder (~325 mesh, 99% pure) was ground in a mortar and pestle for 2 minutes. The titania (16.3 g), catalyst carbon mix (2.8 g) and ammonium chloride (2.0 g) were added to the titanium powder and mixed again over 5 minutes. An amount (1.0) of ammonium chloride is spread evenly on the bottom of the reaction vessel. The titanium-containing reactant mixture is then spread evenly into the reaction vessel, which has a volume capacity of about 75 cc. A nitrogen flow having a flow rate of about 22 SCFH and a HCl gas flow at a rate of about 0.5 SCFH is provided to the reaction chamber. Positive pressure is maintained at about 8 to 10 psi. One end of the reactant bed is ignited by means of a molybdenum wire mounted on a copper electrode through which current flows, heating the wire to an ignition temperature of about 1600° C. Depending upon the amperage and voltage applied, the ignition temperature is reached and the bed ignited within about 10 seconds. The reaction is completed within about 5 minutes. The bed is allowed to cool for about 20 minutes. The crude product is soft with a golden yellow color. The crude is ball milled for 5 minutes and analyzed for chemical and physical properties.

EXAMPLES 4–10

TiNw Preparation using Ni Catalyst

In Examples 4–10, titanium nitride whiskers were prepared, using the nickel-nitrate carbon catalyst ("catalyst") of Example 2, according to the reactant preparation sequence of Example 3. The total weight of the Ti and the $TiO_2$ is 35 g. The Ti to $TiO_2$ ratio is shown. Amounts of all other reactants shown are given in weight %.

The average properties of the "crude" obtained (total titanium nitride whiskers as product mixed with the titanium nitride powder and particulate as product) were as follows:
Total carbon=0.2 to 3%
Total oxygen=2 to 10%
Total nitrogen=16 to 20%
Surface Area=2 to 3 $m^2$/gm
Whisker Diameter=0.5 microns
Whisker Length=1 to 30 microns
Aspect Ratio=5 to 20

EXAMPLE 4

The following reactants were provided to the reaction chamber in the following amounts and subjected to the following conditions:
Ti:$TiO_2$ Ratio 1.08:1
Ti+$TiO_2$ 35 g
$NH_4Cl$ in mix 3.4 wt. %
Carbon+Catalyst 13.4 wt. %
$NH_4Cl$ in Bed 1.0 wt. %
Nitrogen Flow 20 SCFH
Nitrogen (psi) 14.5
HCl Flow 1 SCFH

EXAMPLE 5

The following reactants were provided to the reaction chamber in the following amounts and subjected to the following conditions:
Ti:$TiO_2$ 1.01:1
Ti+$TiO_2$ 35 g
$NH_4Cl$ in mix 3.4 wt. %
Carbon+Catalyst 14 wt. %
$NH_4Cl$ bed 1.0 wt. %
Nitrogen Flow 20 SCFH
Nitrogen (psi) 14.5
HCl Flow 1 SCFH

EXAMPLE 6

The following reactants were provided to the reaction chamber in the following amounts and subjected to the following conditions:
Ti:$TiO_2$ 1.11:1
Ti+$TiO_2$ 35 g
$NH_4Cl$ in mix 6.3 wt. %
Carbon+Catalyst 11.4 wt. %
$NH_4Cl$ bed 1.0 wt. %
Nitrogen Flow 20 SCFH
Nitrogen (psi) 14.5
HCl Flow 1 SCFH

EXAMPLE 7

The following reactants were provided to the reaction chamber in the following amounts and subjected to the following conditions:
Ti:$TiO_2$ 1.15:1
Ti+$TiO_2$ 35 g
$NH_4Cl$ in mix 3.4 wt. %
Carbon+Catalyst 12 wt. %
$NH_4Cl$ bed 1.0 wt. %
Nitrogen Flow 20 SCFH
Nitrogen (psi) 14.5
HCl Flow 1 SCFH

EXAMPLE 8

The following reactants were provided to the reaction chamber in the following amounts and subjected to the following conditions:
Ti:$TiO_2$ 1.07:1
Ti+$TiO_2$ 35 g
$NH_4Cl$ in mix 3.4 wt. %
Carbon+Catalyst 19.7 wt. %
$NH_4Cl$ bed 1.0 wt. %
Nitrogen Flow 20 SCFH
Nitrogen (psi) 14.5
HCl Flow 1 SCFH

EXAMPLE 9

The following reactants were provided to the reaction chamber in the following amounts and subjected to the following conditions without the nitrogen being under pressure:
Ti:$TiO_2$ 1.06:1
Ti+$TiO_2$ 35 g
$NH_4Cl$ in mix 3.4 wt. %
Carbon+Catalyst 14 wt. %
$NH_4Cl$ bed 1.0 wt. %
Nitrogen Flow 45 SCFH
HCl Flow 3 SCFH

EXAMPLE 10

The following reactants were provided to the reaction chamber in the following amounts and subjected to the following conditions without the nitrogen being under pressure:
Ti:$TiO_2$ 1:1
Ti+$TiO_2$ 35 g
$NH_4Cl$ in mix 3.4 wt. %
Carbon+Catalyst 14 wt. %
$NH_4Cl$ bed 1.0 wt. %
Nitrogen Flow 45 SCFH
HCl Flow 3 SCFH

EXAMPLES 11–13

TiNw Synthesis Using Different Catalysts

Examples 11–13 were conducted using cobalt acetate, iron nitrate and magnesium nitrate catalyst mixtures instead of the nickel nitrate catalyst used in Examples 4–10.

EXAMPLE 11

The following reactants were provided to the reaction chamber in the following amounts and subjected to the following conditions:
Ti:$TiO_2$ 1.08:1
Ti+$TiO_2$ 35 g NH$_4$Cl in mix 3.4 wt. %
Carbon+Cobalt
Catalyst 15 wt. %
NH$_4$Cl bed 1.0 wt. %
Nitrogen Flow 20 SCFH
Nitrogen (psi) 14.5
HCl Flow 1 SCFH

EXAMPLE 12

The following reactants were provided to the reaction chamber in the following amounts and subjected to the following conditions:
Ti:TiO$_2$ 1.10:1
Ti+TiO$_2$ 35 g
NH$_4$Cl in mix 3.4 wt. %
Carbon+Iron
Nitrate Catalyst 15 wt. %
NH$_4$Cl bed 1.0 wt. %
Nitrogen Flow 20 SCFH
Nitrogen (psi) 14.5
HCl Flow 1 SCFH

EXAMPLE 13

The following reactants were provided to the reaction chamber in the following amounts and subjected to the following conditions:
Ti:TiO$_2$ 1.10:1
Ti+TiO$_2$ 35 g
NH$_4$Cl in mix 3.4 wt. %
Carbon+Mg
Nitrate Catalyst 15 wt. %
NH$_4$Cl bed 1.0 wt. %
Nitrogen Flow 20 SCFH
Nitrogen (psi) 14.5
HCl Flow 1 SCFH The formulation of Example 11 produced TiN whiskers in yields of from about 5 to about 15 volume % of total TiN particulate and whiskers produced. The formulation of Example 12 produced a TiN whisker yield of from about 5 to about 10 volume % of the total TiN particulate and whiskers produced. The formulation of Example 13 produced a TiN whisker yield of from about 0 to about 5 volume % of the total TiN particulate and whiskers produced.

EXAMPLES 14–15

TiNw Synthesis Using Different Reactant Gases

Examples 14–15 were conducted using differing amounts of reactant gases.

EXAMPLE 14

The following reactants were provided to the reaction chamber in the following amounts and subjected to the following conditions:
Ti:TiO$_2$ 1.1:1
Ti+TiO$_2$ 35 g
NH$_4$Cl in mix 20 wt. %
Carbon+Nickel
Nitrate Catalyst 13.5 wt. %
NH$_4$Cl bed 1.0 wt. %
Nitrogen Flow 15 SCFH
Nitrogen (psi) 14.5
Ammonia Flow 1 SCFH
Chlorine Flow 2 SCFH
Pressure, psig 10

EXAMPLE 15

The following reactants were provided to the reaction chamber in the following amounts and subjected to the following conditions:
Ti:TiO$_2$ 1.1:1
Ti+TiO$_2$ 35 g
NH$_4$Cl in mix 2.0 wt. %
Carbon+Iron
Nitrate Catalyst 13.4 wt. %
NH$_4$Cl bed 1.0 wt. %
Nitrogen Flow 15 SCFH
Nitrogen (psi) 14.5
Ammonia Flow 1 SCFH
Chlorine Flow 2 SCFH
Pressure, psig 10

The formulations of Examples 14–15 gave TiN whisker volume % yields of up to 30 vol. %, with the formulation of Example 15 giving slightly better yields than Example 14.

Many other modifications and variations of the present invention are possible to the skilled practitioner in the field in light of the teachings herein. It is therefore understood that, within the scope of the claims, the present invention can be practiced other than as herein specifically described.

What is claimed is:

1. A method for making titanium nitride whiskers comprising: in concurrent reactions in a reactant bed,
   reacting titanium in the presence of nitrogen in a direct nitridation reaction under conditions necessary to make titanium nitride whiskers; and
   reacting titania in the presence of nitrogen in a carbothermal nitridation reaction under conditions necessary to make titanium nitride whiskers.

2. The method according to claim 1, further comprising reacting titanium and titania in the presence of nitrogen and a transport species selected from the group consisting of halogens and halogen-containing compounds under conditions necessary to make titanium nitride whiskers.

3. The method according to claim 1, wherein the reactant bed comprises titanium, titania, ammonium chloride and a metal-containing carbon catalyst.

4. The method according to claim 3, wherein the reactant bed is placed into a reaction vessel.

5. The method according to claim 3, wherein the reactant bed is heated to initiate the direct nitridation reaction.

6. The method according to claim 3, wherein the titanium is provided to the reactant bed in a form selected from the group consisting of titanium fibers, titanium shavings and titanium powder.

7. The method according to claim 3, wherein the metal-containing carbon catalyst comprises carbon selected from the group consisting of carbonized cotton, carbonized cellulose and carbon powder.

8. The method according to claim 3, wherein the metal-containing carbon catalyst comprises a metal selected from the group consisting of nickel, magnesium, cobalt, manganese, iron and combinations thereof.

9. The method according to claim 8, wherein the metal-containing carbon catalyst comprises nickel nitrate.

10. The method according to claim 8, wherein the metal-containing carbon catalyst comprises a metal-containing compound selected from the group consisting of nickel nitrate, magnesium nitrate, cobalt acetate, iron nitrate and mixtures thereof.

11. The method according to claim 3, wherein the reactant bed has a bulk density of from about 0.05 g/cc to about 0.20 g/cc.

12. The method according to claim 3, further comprising providing a flow of gas to the reactant bed, said gas selected from the group consisting of chlorine, ammonia, argon, hydrogen chloride, halogen-containing gases and halide-containing gases.

13. The method according to claim 1 wherein the reactant bed comprises titanium, titania, a metal-containing carbon catalyst, and ammonium chloride in the presence of nitrogen, said bed having a bulk density of from about 0.05 g/cc to about 0.2 g/cc; and locally heating the reactant bed, whereby titanium nitride whiskers are produced.

14. A method for making titanium nitride whiskers comprising: in concurrent reactions in a reactant bed, reacting titanium in the presence of nitrogen in a direct nitridation reaction under conditions necessary to make titanium nitride whiskers; and reacting titanium in the presence of nitrogen in a transport species reaction under conditions necessary to make titanium nitride whiskers.

15. The method according to claim 14, wherein the reactant bed comprises titanium, ammonium chloride and a metal-containing carbon catalyst, said bed having a bulk density of about 0.05 g/cc.

16. The method according to claim 15, wherein the titanium is provided to the reactant bed in a form selected from the group consisting of titanium fibers, titanium shavings and titanium powder.

17. The method according to claim 15, wherein the metal-containing carbon catalyst comprises carbon in a form selected from the group consisting of carbonized cotton, carbonized cellulose and carbon powder.

18. The method according to claim 15, wherein the metal-containing carbon catalyst comprises a metal selected from the group consisting of nickel, magnesium, cobalt, manganese, iron and combinations thereof.

19. The method according to claim 18, wherein the metal-containing carbon catalyst comprises nickel nitrate.

20. The method according to claim 15, wherein the metal-containing carbon catalyst comprises a metal-containing compound selected from the group consisting of nickel nitrate, magnesium nitrate, cobalt acetate, iron nitrate and mixtures thereof.

21. The method according to claim 14, further comprising providing a flow of gas to the reactant bed, said gas selected from the group consisting of chlorine, ammonia, argon, hydrogen chloride, halogen-containing gases and halide-containing gases.

22. A method for making titanium nitride whiskers comprising:

providing a reactant bed comprising a mixture of ammonium chloride, titanium, titania, and a metal-containing carbon catalyst;

providing a flow of nitrogen gas to the reactant bed;

providing a flow of hydrogen chloride gas to the reactant bed; and heating the reactant bed to conduct a first direct nitridation reaction concurrently with a second carbothermic nitridation reaction concurrently in the presence of a third transport species reaction, under conditions effective to produce titanium nitride whiskers.

23. A method for making titanium nitride whiskers comprising:

providing a reactant bed having a density no greater than about 0.05 g/cc comprising a mixture of ammonium chloride, titanium, and a metal-containing carbon catalyst;

providing a flow of nitrogen gas to the reactant bed;

providing a flow of a hydrogen chloride gas to the reactant bed; and heating the reactant bed to conduct a direct nitridation reaction concurrently with a transport species reaction, under conditions effective to produce titanium nitride whiskers.

* * * * *